(12) United States Patent
Cheng et al.

(10) Patent No.: US 11,092,861 B2
(45) Date of Patent: Aug. 17, 2021

(54) ELECTRONIC DEVICE

(71) Applicant: Innolux Corporation, Miao-Li County (TW)

(72) Inventors: Chang-Chiang Cheng, Miao-Li County (TW); Huai-Ping Huang, Miao-Li County (TW); Yung-Hsun Wu, Miao-Li County (TW); Peng-Wen Wang, Miao-Li County (TW); Chih-Lung Lin, Miao-Li County (TW); Chia-Hao Tsai, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/668,031

(22) Filed: Oct. 30, 2019

(65) Prior Publication Data

US 2020/0166794 A1 May 28, 2020

(30) Foreign Application Priority Data

Nov. 26, 2018 (CN) .......................... 201811414514.6

(51) Int. Cl.
*G02F 1/1345* (2006.01)
*H01L 27/12* (2006.01)
(Continued)

(52) U.S. Cl.
CPC ........ *G02F 1/13454* (2013.01); *G02F 1/1368* (2013.01); *G02F 1/133603* (2013.01); *G02F 1/133611* (2013.01); *G02F 1/136209* (2013.01); *G02F 1/136286* (2013.01); *G09G 3/3607* (2013.01); *H01L 27/124* (2013.01); *H01L 27/1222* (2013.01); *H01L 27/1255* (2013.01); *H01L 29/78633* (2013.01); *H01L 29/78672* (2013.01); *G02F 2202/104* (2013.01); *G02F 2202/28* (2013.01); *G09G 2300/08* (2013.01); *G09G 2310/0291* (2013.01)

(58) Field of Classification Search
None
See application file for complete search history.

(56) References Cited

U.S. PATENT DOCUMENTS

| 9,541,808 B2 | 1/2017 | Matsumura et al. |
| 9,934,742 B2 | 4/2018 | Yoshida et al. |

(Continued)

FOREIGN PATENT DOCUMENTS

| CN | 103034000 A | 4/2013 |
| CN | 104867462 A | 8/2015 |
| CN | 105580065 A | 5/2016 |

*Primary Examiner* — Nicholas J Lee

(74) *Attorney, Agent, or Firm* — McClure, Qualey & Rodack, LLP

(57) ABSTRACT

An electronic device having a display panel is provided. The display panel includes a first pixel circuit, a second pixel circuit, a first signal line, a second signal line and a first buffer circuit unit. The second pixel circuit is adjacent to the first pixel circuit. The first signal line is electrically connected to the first pixel circuit. The second signal line is electrically connected to the second pixel circuit. The first buffer circuit unit is disposed between the first pixel circuit and the second pixel circuit. At least a portion of the first pixel circuit and at least a portion of the second pixel circuit are disposed between the first signal line and the second signal line.

19 Claims, 10 Drawing Sheets

(51) Int. Cl.
    *H01L 29/786*     (2006.01)
    *G02F 1/1368*     (2006.01)
    *G02F 1/1362*     (2006.01)
    *G02F 1/13357*     (2006.01)
    *G09G 3/36*     (2006.01)

(56) References Cited

U.S. PATENT DOCUMENTS

| | | |
|---|---|---|
| 2013/0321499 A1 | 12/2013 | Park et al. |
| 2015/0243238 A1 | 8/2015 | Jung et al. |
| 2015/0310821 A1 | 10/2015 | Kim et al. |
| 2018/0068629 A1 * | 3/2018 | Shin .................... G09G 3/3688 |

* cited by examiner

ELECTRONIC DEVICE

This application claims the benefit of People's Republic of China application Serial No. 201811414514.6, filed Nov. 26, 2018, the subject matter of which is incorporated herein by reference.

BACKGROUND

Field of the Disclosure

The disclosure relates in general to an electronic device, and more particularly to an electronic device having a narrow border display panel.

Description of the Related Art

In recent years, a common electronic device is usually equipped with a display panel for the purposes of operating the electronic device. For such electronic device, a gate control circuit is required and disposed at both sides of the display panel, and it reduces the width of the active area (AA) of the display panel used for the presentation of visual information. The area of the active area of the display panel decreases with increasing of the area of the non-active area for accommodating the gate control circuit.

Therefore, as the width of the non-active area for the gate control circuit becomes wider, the active area of the display panel has a smaller effective area. Such a factor affects the visual effect provided by the display panel.

SUMMARY

The disclosure is directed to an electronic device wherein a portion of the gate control circuit is disposed at the active area so as to reduce the area of the non-active area of the display panel. The disclosure is applicable to narrow border design.

According to an aspect of the present disclosure, an electronic device including a display panel is provided. The display panel includes a first pixel circuit, a second pixel circuit, a first signal line, a second signal line, and a first buffer circuit unit. The second pixel circuit is adjacent to the first pixel circuit. The first signal line is electrically connected to the first pixel circuit. The second signal line is electrically connected to the second pixel circuit. The first buffer circuit unit is disposed between the first pixel circuit and the second pixel circuit. At least a portion of the first pixel circuit and at least a portion of the second pixel circuit are disposed between the first signal line and the second signal line.

The above and other aspects of the disclosure will become better understood with regard to the following detailed description of the preferred but non-limiting embodiment(s). The following description is made with reference to the accompanying drawings.

DETAILED DESCRIPTION

Figure 1:
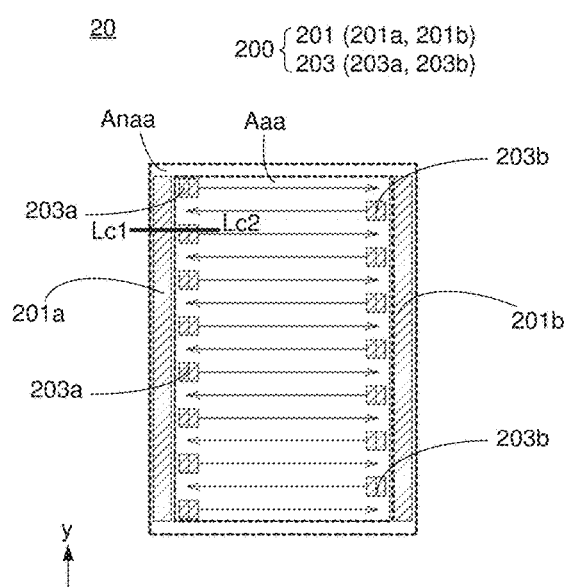
FIG. 1 is a top view illustrating a display panel in which buffer circuit units are disposed at an active area to reduce the border area.

The embodiments are described in details with reference to the accompanying drawings. It is noted that the details of the structures of the embodiments are provided for exemplification, and the described details of the embodiments are not intended to limit the present disclosure. It is noted that not all embodiments of the disclosure are shown. Modifications and variations can be made without departing from the spirit of the disclosure to meet the requirements of the practical applications, and the described embodiments can be combined as required. Thus, there may be other embodiments which are not specifically illustrated in the specification but encompassed by the disclosure.

Moreover, use of ordinal terms such as "first", "second", "third", etc., in the specification and claims to modify an element does not by itself connote any priority, precedence, or order of one claim element over another or the temporal order in which acts of a method are performed, but are used merely as labels to distinguish one claim element having a certain name from another element having the same name to distinguish the claim elements.

Furthermore, the term such as "when" or "as" recited in the specification describes that two events may occur at the same time or one after/before the other, and do not particularly indicate two simultaneous events. The terms such as "above," "over" or "on" recited in the specification not only express directly contact with the object, but also involve indirectly contact with the object. The meaning of "disposed," "arranged," "located," "mounted" or "positioned" is exemplified with reference to the accompanying drawings, and may involve manners such as fixed to, pivotally coupled to, placed on, attached to, and so on. The conjunction "or" between multiple functions (or elements) may indicate just one or any combination of the multiple functions (or elements). Furthermore, the terms such as "electrically connected to" or "coupled to" represent "direct connection" or "indirect connection."

In the specification, the term "adjacent (to)" represents that there is no similar element located between two adjacent elements of the same type in a direction. For example, if an element A is adjacent to an element B, it represents that neither another element A nor another element B exists between the element A and the element B in a direction.

In the specification, if it is described that an element A is located "between" an element B and an element C, it represents that a portion or the entirety of the element A is located between the element B and the element C.

Further, the dimension terms such as "length," "width," or "thickness" of an element are not defined based on the direction, but based on the condition itself. Different dimension terms may be assigned for edges of two elements along the same direction. For example, if an element has a longer edge extending along the x-direction and a shorter edge extending along the y-direction, the size of the longer edge extending along the x-direction is called the length of the element. On the contrary, if another element has a shorter edge extending along the x-direction and a longer edge extending along the y-direction, the size of the shorter edge extending along the x-direction is called the width (or thickness) of the element.

Please refer to FIG. 1, which is a top view illustrating that buffer circuit units 203 are disposed at an active area to reduce the border area. The display panel 20 is divided into an active area (visible display area) Aaa and a non-active area Anaa. In the specification, the active area Aaa of the display panel 20 is defined as an area for presenting visual information, and the non-active area Anaa is defined as a border area around the active area Aaa and does not present visual information. As usual, relative control circuits of the display panel 20 are disposed at the non-active area Anaa.

The display panel 20 includes a gate control circuit 200, which includes shifter circuit units 201 (201a, 201b) and buffer circuit units 203 (203a, 203b). The buffer circuit units 203a, 203b include a plurality of buffer thin-film transistors (buffer TFTs) for amplifying the gate control signals received from the shifter circuit units 201a, 201b. The buffer circuit units 203a, 203b occupy about 30% area of the gate control circuit 200. Therefore, if the buffer circuit units 203a, 203b are moved to the active area Aaa of the display panel 20, the gate control circuit 200 located at the non-active area Anaa can occupy less area so as to reduce the border area of the display panel 20.

Capacitors are required in the gate control circuit 200 to isolate interference among the gate control signals. The capacitance of the capacitors should be high enough to ensure a good isolation effect. Capacitors with larger areas can provide greater capacitance, but such capacitors are disadvantageous to narrow border display panels. According to the embodiment of the disclosure, multi-layer capacitor structure is used in the shifter circuit units 201 to form capacitors connected in parallel to increase the overall capacitance.

Figure 2A:
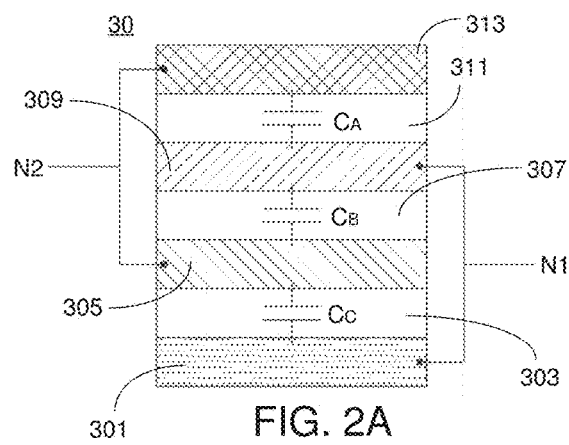
FIG. 2A is a cross-sectional view illustrating a multilayer capacitor structure used in the non-active area of the display panel.

Please refer to FIG. 2A, which is a cross-sectional view illustrating a multilayer capacitor structure used in the non-active area Anaa of the display panel. The multi-layer capacitor structure 30 includes a light-shielding (LS) layer 301, a buffer layer 303, a polysilicon (PS) layer 305, a gate insulating layer 307, a first metal layer (M1) 309, an interlayer dielectric (ILD) 311 and a second metal layer (M2) 313.

The buffer layer 303 is formed on the light-shielding layer 301; the polysilicon layer 305 is formed on the buffer layer 303; the gate insulating layer 307 is formed on the polysilicon layer 305; the first metal layer (M1) 309 is formed on the gate insulating layer 307; the interlayer dielectric 311 is formed on the first metal layer (M1) 309; and the second metal layer (M2) 313 is formed on the interlayer dielectric 311.

The light-shielding layer 301 can comprise a conductive material and the light-shielding layer 301 can shield the polysilicon layer 305 from light which will result in leakage current. In an embodiment, the light-shielding layer 301 may be a single layer or a multi-layer of metal material, but the disclosure is not limited to the embodiment. Any conductive material with light-shielding effect is applicable. In an embodiment, the buffer layer 303 may be a single layer or a multi-layer of insulating material which comprises silicon oxide, silicon nitride, or a combination thereof. The gate insulting layer 307 may be a single layer or a multi-layer of insulating material which comprises silicon oxide, silicon nitride, other suitable insulating material, or a combination thereof, but the disclosure is not limited to the embodiment. The first metal layer 309 may be a single layer or a multi-layer of metal material which comprises aluminum (Al) or copper (Cu). Furthermore, the first metal layer 309 at the active area Aaa may serve as gate electrodes, but the disclosure does not limit the material and function of the first metal layer 309. The interlayer dielectric 311 may be a single layer or a multi-layer of insulating material which comprises silicon oxide, silicon nitride, or other suitable insulating material, but the disclosure is not limited to the embodiment. The second metal layer 313 may be a single layer or multi-layers of metal material which comprises aluminum or copper. Furthermore, the second metal layer 313 at the active area Aaa may serve as source electrodes or drain electrodes, but the disclosure does not limit the material and function of the second metal layer 13.

The interlayer dielectric 311, the first metal layer (M1) 309 and the second metal layer (M2) 313 collectively form a first capacitor $C_A$; the gate insulating layer 307, the first metal layer (M1) 309 and the polysilicon layer 305 collectively form a second capacitor $C_B$; and the buffer layer 303, the polysilicon layer 305 and the light-shielding layer 301 collectively form a third capacitor $C_C$. Further, the first metal layer (M1) 309 is electrically connected to the light-shielding layer 301 through a first node N1, and the polysilicon layer 305 is electrically connected to the second metal layer (M2) 313 through a second node N2.

Figure 2B:
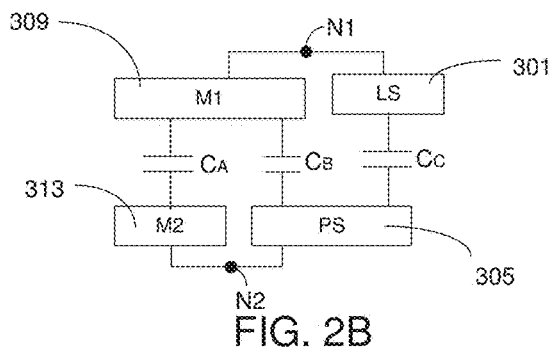
FIG. 2B is a schematic diagram illustrating the parallel connection formed in the capacitor of the multi-layer metal structure of FIG. 2A.

Please refer to FIG. 2B, which is a schematic diagram illustrating the parallel connection formed in the capacitor of the multi-layer metal structure of FIG. 2A. By arranging the position of the elements in the multi-layer metal structure 30 based on the connection relation, it shows that the first capacitor $C_A$, the second capacitor $C_B$ and the third capacitor $C_C$ are connected to each other in parallel. In other words, the multi-layer metal structure 30 can generate the effect of parallel capacitor and also increase the capacitance. Further, the multi-layer metal structure 30 with increased capacitance occupies less area.

If the display panel 20 is edge-lit, a bezel is provided at the bottom and the lateral side of the backlight module to fix the device. The bezel will increase the border width and the overall thickness of the display panel. Therefore, the disclosure can adopt direct light design including a light source layer having multiple light-emitting elements. Full lamination technology may be applied to combine all layers of the backlight module by using adhesive layers to further reduce the border region and the overall thickness of the display panel 20. The adhesive layers may be optically clear adhesive (OCA) or other adhesive material suitable for the light source layer and having a proper index of refraction.

Figure 3:
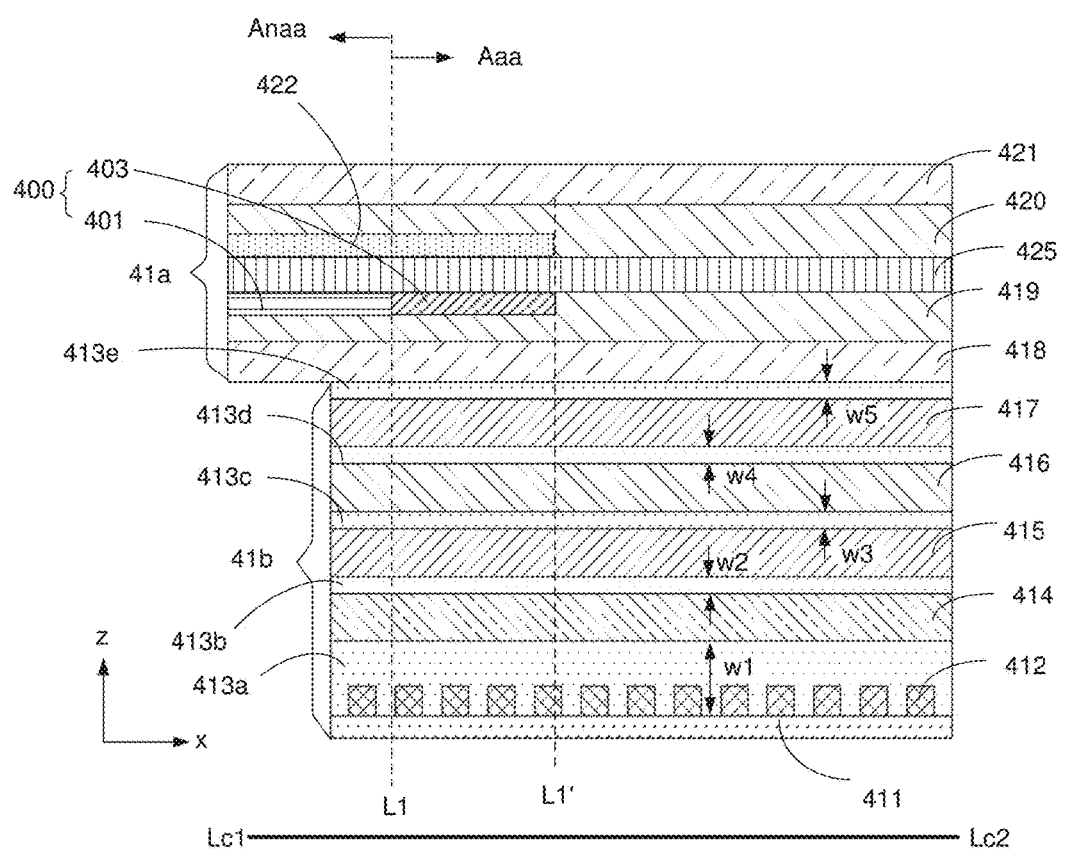
FIG. 3 is a cross-sectional view illustrating that light-emitting diodes and adhesive layers are provided in the electronic device to reduce the thickness and width of the display panel.

In the electronic device, the display panel is stacked on the backlight module. FIG. 3 is a cross-sectional view illustrating the display panel 41a and backlight module 41b overlapping each other. The cross-sectional view corresponds to a cutting line Lc1-Lc2 in FIG. 1.

Please refer to the cross-sectional view of FIG. 3, illustrating that the light source layer and the adhesive layers are provided in the electronic device to reduce the thickness and width of the display panel. The display panel 41a has a greater area than the backlight module 41b, and the active area Aaa of the display panel 41a has a smaller area than the backlight module 41b. Therefore, a portion of the non-active area Anaa of the display panel 41a covers a portion of the light source layer 412 of the backlight module 41b, and the other portion of the non-active area Anaa is beyond the backlight module 41b. The structure of the backlight module 41b and the display panel 41a are described in the following.

In FIG. 3, the backlight module 41b includes, in an order from bottom to top, a substrate (for example, a flexible print circuit (FPC)) 411, a light source layer 412 (for example, light-emitting diode (LED), mini light-emitting diode (Mini LED), micro light-emitting diode (Micro-LED) or other proper light source) formed on the substrate 411, an adhesive layer 413a formed on the light source layer 412, a phosphor layer 414 formed on the adhesive layer 413a, an adhesive layer 413b formed on the phosphor layer 414, a brightness enhancement film 415 formed on the adhesive layer 413b, an adhesive layer 413c formed on the brightness enhancement film 415, an optical diffuser 416 formed on the adhesive layer 413c, an adhesive layer 413d formed on the optical diffuser 416, and a brightness enhancement film 417 formed on the adhesive layer 413d.

The brightness enhancement films 415, 417 can focus the light within the vertical region of the display panel 41a to enhance the light utilization efficiency of the backlight module 41b. The transmission haze of the optical diffuser 416 can make the light uniformly distributed and increase visual softness. By disposing the optical diffuser 416 between the brightness enhancement films 415 and 417, the light utilization efficiency and light uniformity of the backlight module 41b can be improved. For example, the brightness enhancement films 415, 417 are Advanced Structured Optical Composites (ASOC).

The adhesive layers 413a, 413b, 413c, 413d are used to combine layers. Each adhesive layer 413a, 413b, 413c, 413d has a respective thickness which may be different from one another, and the thickness is determined according to the position and material of the contact layer. For example, the adhesive layer 413a formed on the light source layer 412 is the thickest adhesive layer so as to reduce the grainy effect of the light-emitting elements with a certain height. On the other hand, the adhesive layers 413c, 413e formed on the brightness enhancement films 415, 417 should not be too thick to fill in and level up the prismatic structure of the brightness enhancement films 415, 417.

It is assumed that the adhesive layers 413a, 413b, 413c, 413d and 413e have a first thickness W1, a second thickness W2, a third thickness W3, a forth thickness W4 and a fifth thickness W5, respectively. Thus, the first thickness W1 is the thickest one among all of the thicknesses W1~W5, that is, W1=max{W1, W2, W3, W4, W5}.

The display panel 41a is attached to the backlight module 41b through the adhesive layer 413e. The display panel 41a includes, in an order from bottom to top, a polarizing film 418, a thin film transistor (TFT) substrate 419 formed on the polarizing film 418, a liquid crystal (LC) layer 425 formed on the thin film transistor substrate 419, a color filter substrate 420 formed on the liquid crystal layer 425, and a polarizing film 421 formed on the color filter substrate 420. FIG. 3 is a simplified drawing without presenting other known elements, for example, sealant.

A black matrix 422 is provided in the color filter substrate 420, and a gate control circuit 400 is provided in the thin film transistor substrate 419. According to an embodiment of the disclosure, the gate control circuit 400 includes two parts: buffer circuit units 403 located at the active area Aaa, and shifter circuit units 401 located at the non-active area Anaa.

The dashed line L1 indicates the boundary between the active area Aaa and the non-active area Anaa. The black matrix 422 in the color filter substrate 420 extends from an edge of the display panel 41a to the dashed line L1'. In the gate control circuit 400 in the thin film transistor substrate 419, the shifter circuit units 401 extend from the edge of the display panel 41a to the dashed line L1, and the buffer circuit units 403 extend from the dashed line L1 to the dashed line L1'. Therefore, the light source layer 412 partially is overlaps the shifter circuit units 401.

In an embodiment, to reduce the thickness of the backlight module 41b, the optic diffuser 416 could be replaced with an adhesive layer with diffusion function. In other words, a single layer of the adhesive layer functions as both the adhesive layers 413c, 413d, and the optical diffuser 416.

In an embodiment, to simplify the manufacturing process of the backlight module 41b, white light-emitting diodes could be used in the backlight module 41b. The use of the white light-emitting diodes can eliminate the thickness of the phosphor layer 414 and the adhesive layer 413b.

Figure 9:
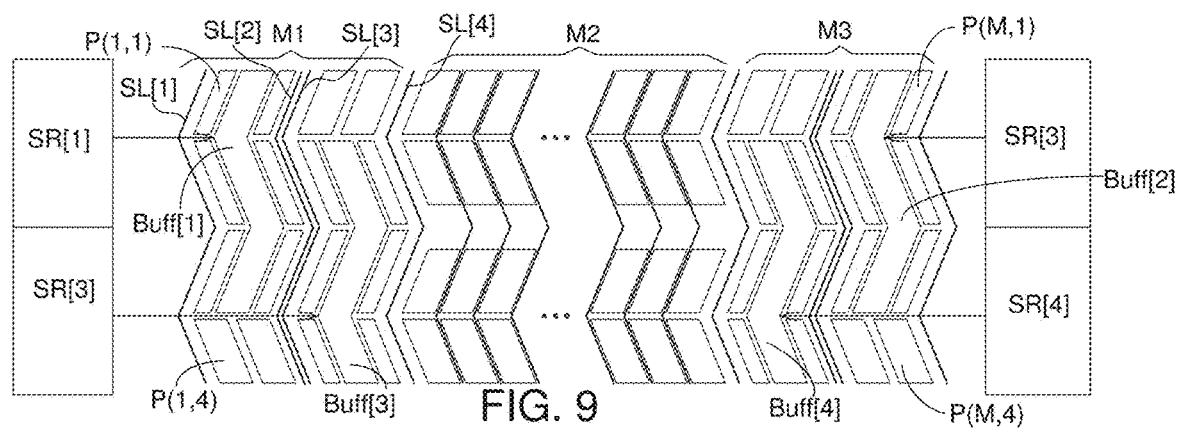
FIG. 9 is a top view illustrating the pixel circuits and the gate control circuit of the display panel according to a further embodiment of the disclosure.
Figure 10:
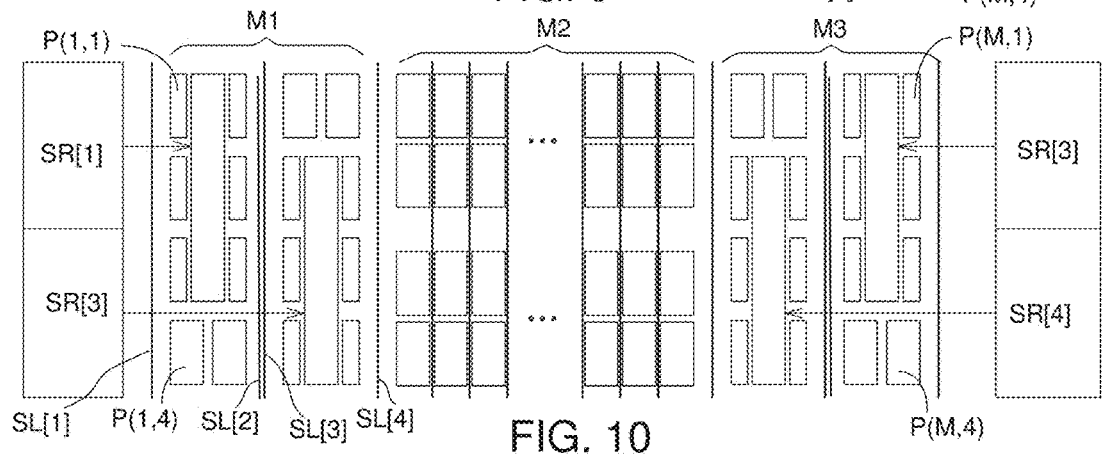
FIG. 10 is a top view illustrating the pixel circuits and the gate control circuit of the display panel according to a further embodiment of the disclosure.

According to the above description, the buffer circuit units and the corresponding black matrix are disposed at a portion of the active area Aaa. The concepts of the disclosure are described with reference to FIG. 4~FIG. 10 in the following. The embodiments with reference to FIG. 4~FIG. 10 can work independently or collectively in any combination as required. FIG. 4~FIG. 8 address the arrangement of gate control lines GL[1]~GL[N], pixel circuits P(1,1)~P(M,N), and buffer circuit units Buff[1]~Buff[N]. FIG. 9 and FIG. 10 address the arrangement of data lines SL[1]~SL[M], pixel circuits, pixel circuits P(1,1)~P(M,N) and buffer circuit units Buff[1]~Buff[N]. The pixel circuits defined and described in the specification include at least driver transistors, pixel capacitors (pixel electrodes, display media, and common electrodes) and storage capacitors.

Figure 4:
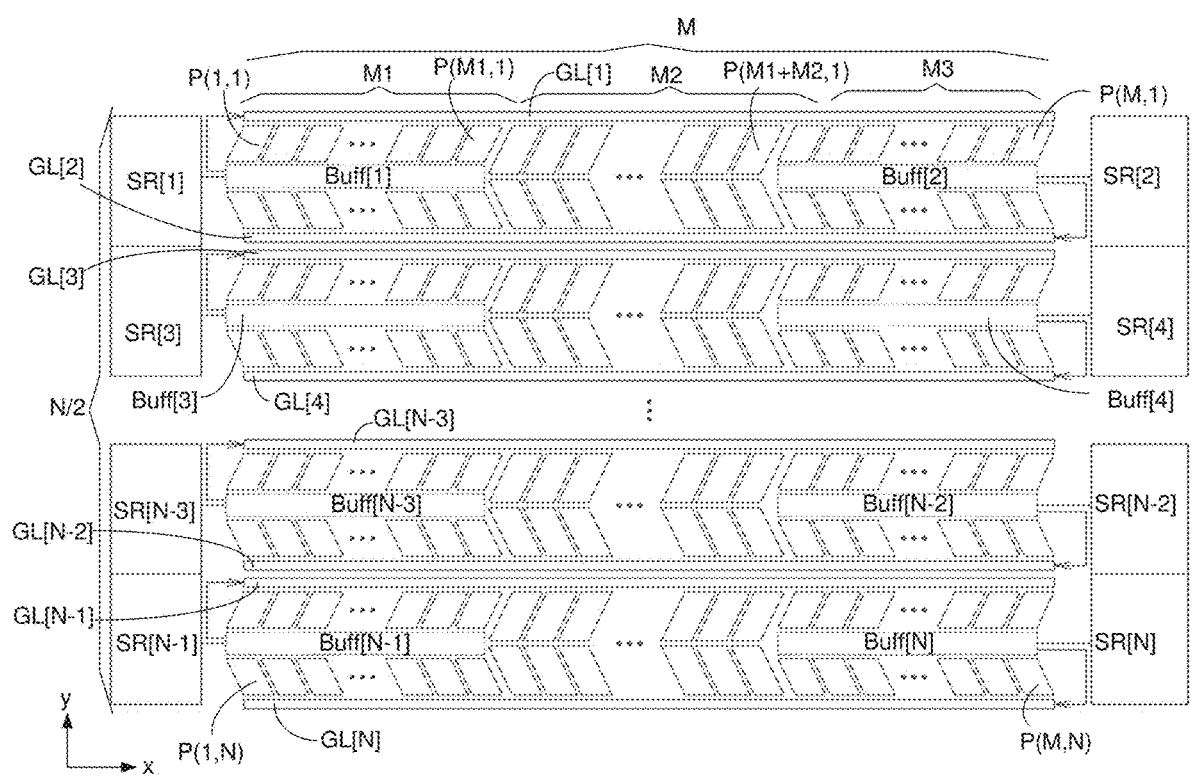
FIG. 4 is a top view illustrating the pixel circuits and the gate control circuit of the display panel according to an embodiment of the disclosure.

Please refer to FIG. 4, which is a top view illustrating the pixel circuits and the gate control circuit of the display panel according to an embodiment of the disclosure. In the display panel, there are pixel circuits arranged in M columns and N rows and corresponding signal lines. The signal lines may comprise gate control lines, data lines, common signal lines, and so on, but are not limited to. For example, the signal lines may be gate control lines GL for transmitting gate control signals, data lines SL for transmitting pixel grayscale voltages, or common signal lines for transmitting common signals. Through the signal lines, a timing controller of the display panel can transmit related control signals and data signals to corresponding pixel circuits. The disclosure does not limit the shape and color of the pixel circuits in applications. For example, each pixel circuit may be one of a red (R) pixel circuit, a green (G) pixel circuit, and a blue (B) pixel circuit.

In the following description, the symbols m and n represent the column number and the row number of the designated pixel circuit. Therefore, m is smaller or equal to M, and n is smaller or equal to N, wherein m, n, M, N are positive integers. M*N pixel circuits are corresponding to M data lines SL[1]~SL[M] and N gate control lines GL[1]~GL[N]. In the embodiment with reference to FIG. 4, the relative positions between the gate control lines GL[1]~GL[N] and the pixel circuits P(1,1)~P(M,N) are adjusted. N gate control lines GL[1]~GL[N] are electrically connected to N shifter circuit units SR[1]~SR[N], N buffer circuit units Buff[1]~Buff[N] and N rows of pixel circuits P(m,1)~P(m,N) (m=1~M), respectively. It is noted that the relative position between the gate control lines GL[1]~GL[N], the rows of pixel circuits according to the positions, or ordinal numbers of the rows may be different, depending on different design requirement. In FIG. 4, if n is an odd number, the gate control line GL[n] is disposed at a first side (for example, upper side in the top view) of the nth row of pixel circuits P(1,n)~P(M,n) and extends along the direction of the nth row of pixel circuits P(1,n)~P(M,n). On the contrary, if n is an even number, the gate control line GL[n] is disposed at a second side (for example, lower side in the top view) of the nth row of pixel circuits P(1,n)~P(M,n) and extends along the direction of the nth row of pixel circuits P(1,n)~P(M,n), In this embodiment, N is a positive even number. In another embodiment, N is a positive odd number and the unpaired gate control line can connect to one shifter circuit unit.

In. FIG. 4, the shifter circuit units SR[1], SR[3], . . . , SR[N-1] and the buffer circuit units Buff[1], Buff[3], . . . , Buff[N-1] corresponding to the odd rows of pixel circuits (n is an odd number) are located on the left portion (first portion) of the display panel. On the contrary, the shifter circuit units SR[2], SR[4], . . . , SR[N] and the buffer circuit units Buff[2], Buff[4], . . . , Buff[N] corresponding to the even rows of pixel circuits (n is an even number) are located on the right portion (second portion) of the display panel. It is to be noted that the disclosure does not limit the positions of the shifter circuit units SR[1]~SR[N] and the buffer circuit units Buff[1]~Buff[N]. For example, the shifter circuit units SR[1]~SR[N] and the buffer circuit units Buff[1]~Buff[N] could be disposed on the upper portion, the lower portion or any portion of the display panel to meet design and application requirements. The positions of the shifter circuit units SR[1], SR[2] along the y direction correspond to the first row of pixel circuits P(1,1)~P(M,1) and the second row of pixel circuits P(1,2)~P(M,2). Similarly, the positions of the shifter circuit units SR[3], SR[4] along the y direction correspond to the third row of pixel circuits P(1,3)~P(M,3) and the fourth row of pixel circuits P(1,4)~P(M,4).

Now, the arrangement of the buffer circuit units are described by taking n=1 and n=2 as an example. In this diagram, the positions of the buffer circuit units Buff[1] and Buff[2] correspond to each other along the y direction. That is, both the buffer circuit units Buff[1] and Buff[2] are disposed between the first row of pixel circuits P(1,1)~P(M,1) and the second row of pixel circuits P(1,2)~P(M,2). The pixel circuits P(1,1)~P(M1,1) are disposed at the upper side of the buffer circuit unit Buff[1], and the pixel circuits P(1,2)~P(M1,2) are disposed at the lower side of the buffer circuit unit Buff[1]. Similarly, the pixel circuits P(M1+M2+1,1)~P(M,1) are disposed at the upper side of the buffer circuit unit Buff[2], and the pixel circuits P(M1+M2+1,2)~P(M,2) are disposed at the lower side of the buffer circuit unit Buff[2]. In other words, no buffer circuit unit is disposed at the lower side of the M2 pixel circuits P(M1+1,1)~P(M1+M2,1) in the middle portion of the M pixel circuits P(1,1)~P(M,1) arranged in the first row. Similarly, no buffer circuit unit is disposed at the upper side of the M2 pixel circuits P(M1+1,2)~P(M+M2,2) in the middle portion of the M pixel circuits P(1,2)~P(M,2) arranged in the second row.

In an embodiment, taking the M pixel circuits P(1,n)~P(M,n) arranged in the nth row as an example, the M1 pixel circuits P(1,n)~P(M1,n) and the M3 pixel circuits P(M1+M2+1,n)~P(M,n) have a smaller size; while the M2 pixel circuits P(M1+1,n)~P(M1+M2,n) have a greatersize.

As shown in FIG. 4, the M pixel circuits P(1,n)~P(M,n) arranged in the nth row have three types of pixel circuits. The first type includes M1 pixel circuits P(1,n)~P(M1,n) (for example, M1=9) located at the left portion, the second type includes M2 pixel circuits P(M1+1,n)~P(M1+M2,n) (for example, M2=1062) located in the middle portion, and the third type includes M3 pixel circuits P(M1+M2+1,n)~P(M,n) (for example, M3=9) located on the right portion. M1, M2, and M3 are natural numbers, M is a sum of M1, M2, and M3, M1 is equal to M3, and M2 is greater than M1. Among the M pixel circuits P(1,n)~P(M,n) arranged in the nth row, the sizes of the pixel circuits in different columns may be different.

As shown in FIG. 4, in an embodiment, the display panel includes a first signal line (first gate control line) GL[n] electrically connected to a first pixel circuit P(m,n); and a first buffer circuit unit Buff[n] for amplifying a gate signal transmitted to the first pixel circuit P(m,n). The pixel circuit P(m,n) is disposed between the first signal line (first gate control line) GL[n] and the first buffer circuit unit Biff[n], and m and n are nature numbers. For example, the first signal line (first gate control line) GL[1] is electrically connected to the first pixel circuit P(1,1); the first buffer circuit unit Buff[1] amplifies the gate signal transmitted to the first pixel circuit P(1,1); and the first pixel circuit P(1,1) is disposed between the first signal line (first gate control line) GL[1] and the first buffer circuit unit Buff[1]. In this embodiment, the signal line is described as the gate control line, but could serve as other signal line which has been mentioned in the above embodiments, and the disclosure is not limited to the embodiment.

In another embodiment, the display panel includes a first signal line (first gate control line) GL[n] electrically connected to a first pixel circuit (m,n); a second signal line GL[n+1] electrically connected to a second pixel circuit P(m,n+1); a first buffer circuit unit Buff[n] disposed between the first pixel circuit P(m,n) and the second pixel circuit P(m,n+1), wherein at least a portion of the first pixel circuit P(m,n) and at least a portion of the second pixel circuit P(m,n+1) are disposed between the first signal line GL[n] and the second signal line GL[n+1]; a third pixel circuit P(m,n+2) adjacent to the second pixel circuit P(m,n+1); a third signal line (third gate control line) GL[n+2] electrically connected to the third pixel circuit P(m,n+2), wherein the second signal line GL[n+1] and the third signal line GL[n+2] are disposed between at least a portion of the second pixel circuit P(m,n+1) and at least a portion of the third pixel circuit P(m,n+2) adjacent to the second pixel circuit P(m, n+1); a second buffer circuit unit Buff[n+2] adjacent to the first buffer circuit Buff[n], wherein at least a portion of the second pixel circuit P(m,n+1) and at least a portion of the third pixel circuit P(m,n+2) are disposed between the first buffer circuit unit Buff[n] and the second buffer circuit unit Buff[n+2].

For example, the display panel includes a first signal line (first gate control line) GL[1] electrically connected to the first pixel circuit P(1,1); a second signal line GL[2] electrically connected to the second pixel circuit P(1,2); a first buffer circuit unit Buff[1] disposed between the first pixel circuit P(1,1) and the second pixel circuit P(1,2), wherein at least a portion of the first pixel circuit P(1, 1) and at least a portion of the second pixel circuit P(1,2) are disposed between the first signal line GL[1] and the second signal line GL[2]; a third pixel circuit P(1,3) adjacent to the second pixel circuit P(1,2); a third signal line (third gate control line) GL[3] electrically connected to the third pixel circuit P(1,3), wherein the second signal line GL[2] and the third signal line GL[3] are disposed between at least a portion of the second pixel circuit P(1,2) and at least a portion of the third pixel circuit P(1,3); a second buffer circuit unit Buff[3] adjacent to the first buffer circuit unit Buff[1], wherein at least a portion of the second pixel circuit P(1,2) and at least a portion of the third pixel circuit P(1,3) are disposed between the first buffer circuit unit Buff[1] and the second buffer circuit Buff[3]. This embodiment adopts double-sided driving technology, but single-sided driving is also applicable in the disclosure to eliminate buffer circuit units and shifter circuit units at one side of the display panel in FIG. 4. The layout of the signal lines could be adjusted to meet design requirements.

In the specification, the wording "adjacent (to)" represents that there is no similar element located between two adjacent elements of the same type. In other words, other type of element(s) may or may not exist between two adjacent elements of the same type. Based on such definition, the first row of pixel circuits P(1,1)~P(M,1) are adjacent to the second row of pixel circuits P(1,2)~P(M,2), and the second row of pixel circuits P(1,2)~P(M,2) are adjacent to the third row of pixel circuits P(1,3)~P(M,3).

Figure 5:
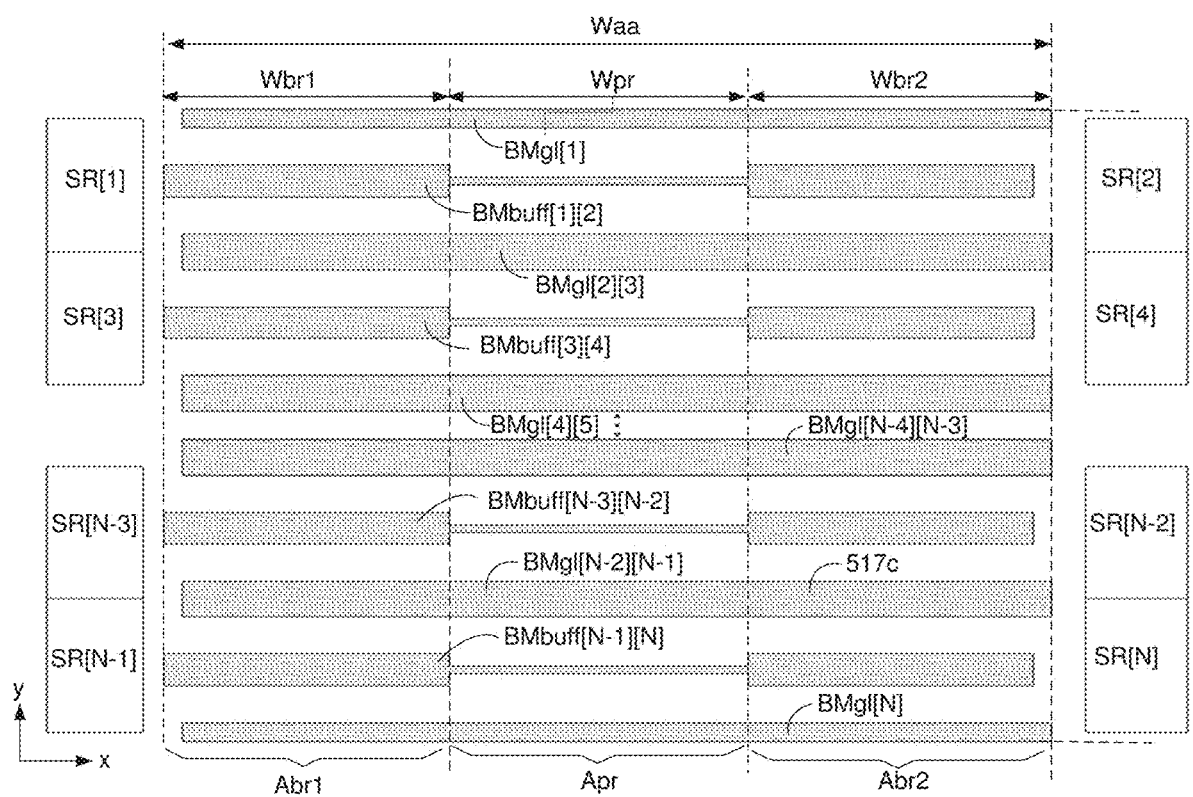
FIG. 5 is a top view illustrating the different shape of the black matrix corresponding to the positions of the buffer circuit units in the display is panel.

FIG. 5 is a top view illustrating the arrangement of the black matrix corresponding to the positions of the buffer circuit units in the display panel. Please refer to both FIG. 4 and FIG. 5 for further description. In FIG. 5, the black matrix is shown by the shaded pattern.

As shown in FIG. 5, in another embodiment, the display panel further includes a black matrix (for example, made of photoresist material) covering the buffer circuit units. The black matrix in the color filter substrate overlaps the buffer circuit units in the thin film transistor substrate in the top view to reduce the light reflection at the active area resulting from the metal layer.

According to the different of the circuit which is covering by black matrix, the black matrix includes black matrix elements of two distinct shapes along the x-direction (first direction) to cover circuits or signal lines. For example, one type includes wiring region-black matrix elements BMgl for covering the gate control lines GL, and the other type includes buffer region-black matrix elements BMbuff for covering the buffer circuit units Buff.

The wiring region-black matrix elements BMgl and the buffer region-black matrix elements BMbuff are parallel to the first direction and alternately arranged. The shapes and quantities of the wiring region-black matrix elements BMgl and the buffer region-black matrix elements BMbuff corresponding to different covered circuits are also different.

The black matrix includes multiple wiring region-black matrix elements BMgl. A first wiring region-black matrix element BMgl[1] of the wiring region-black matrix elements BMgl covers the gate control line GL[1] and is disposed along a first edge of the display panel. A second wiring region-black matrix element BMgl[2][3] of the wiring region-black matrix elements BMgl covers the gate control lines GL[2] and GL[3]. Similarly, an (N/2)th wiring region-black matrix element BMgl[N-2][N-1] of the wiring region-black matrix elements cover the gate control lines GL[N-2] and GL[N-1]. A last wiring region-black matrix element BMgl[N] of the wiring region-black matrix elements BMgl covers the gate control line GL[N] and is disposed along a second edge of the display panel. Since the gate control lines GL have a substantially constant width along the x-direction, the wiring region-black matrix elements BMgl covering the gate control lines GL may be in a shape of substantially a rectangle, but the shape is not limited in the disclosure.

Further, the black matrix includes multiple buffer region-black matrix elements BMbuff. A first buffer region-black matrix element BMbuff[1][2] of the buffer region-black matrix elements BMbuff covers the buffer circuit units Buff[1] and Buff[2] and extends out to partially cover the first row of pixel circuits P(1,1)~P(M,1) and the second row of pixel circuits P(1,2)~P(M,2). The nth buffer region-black matrix element BMbuff[2n-1][2n] of the buffer region-black matrix elements BMbuff covers the buffer circuit units Buff[2n-1] and Buff[2n], and extends out to partially cover the (2n-1)th row of pixel circuits P(1,2n-1)~P(M,2n-1) and the (2n)th row of pixel circuits P(1,2n)~P(M,2n). As shown in FIG. 5, the buffer region-black matrix elements BMbuff should cover the buffer circuit units at both sides and the gap between two rows of pixel circuits. Therefore, the buffer region-black matrix elements BMbuff may be in a shape of a kayak paddle (a paddle with a blade on each end), but the shape is not limited in the disclosure (for example, in a shape of a paddle with a single blade on one end).

In the specification, three sub-areas are defined in the active area according to the sizes of the pixel circuits therein. The first sub-area is a buffer-active area Abr1 corresponding to the first column to the (M1)th column of pixel circuits, and the buffer-active area Abr1 has a width Wbr1. The second sub-area is a pixel-active area Apr corresponding to the (M1+1)th column to the (M1+M2)th column of pixel circuits, and the pixel-active area Apr has a width Wpr. The last sub-area is a buffer-active area Abr2 corresponding to the (M1+M2+1)th column to the Mth column of pixel circuits, and the buffer-active area Abr2 has a width Wbr2. In other words, the buffer-active areas overlap the buffer circuit units in the top view. In an embodiment, at least a portion of the buffer circuit units and the buffer-active area Abr1 overlap, and the other portion of the buffer circuit units and the buffer-active area Abr2 overlap. As described above, the buffer region-black matrix elements BMbuff may be in the shape of a kayak paddle. The blade portions (wider portions, for example, along the y direction has a greater width) of the buffer region-black matrix elements BMbuff at two ends for covering the buffer circuit units are located at the buffer-active areas Abr1 and Abr2, respectively. The shaft portion (narrowest portions, for example, along the y direction has a less width) of the buffer region-black matrix elements BMbuff in the middle for covering the gaps between two rows of pixel circuits is located at the pixel-active areas Apr.

Figure 6:
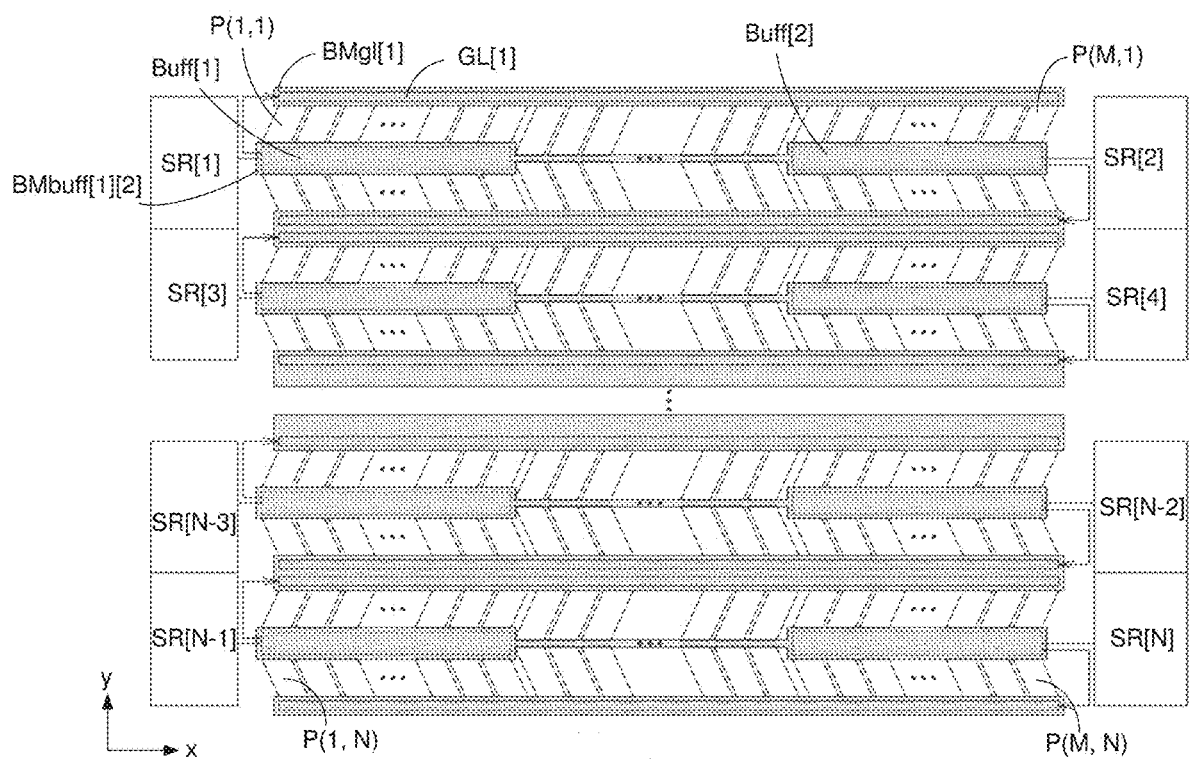
FIG. 6 is a top view illustrating that the display panel of FIG. 4 is covered with the black matrix of FIG. 5.

Please refer to FIG. 6, which is a top view illustrating that the display panel of FIG. 4 is covered with the black matrix of FIG. 5. As shown in FIG. 6, the area ratio of the black matrix at the pixel-active area Apr is less than that at the buffer-active area Abr1, Abr2. In other words, the area of the black matrix in the pixel-active area Apr is less than the area of the black matrix in the buffer-active area Abr1, Abr2. The light from the light source layer will be affected by the area ratio of the black matrix. In brief, less light can be transmitted to the color filter substrate when the black matrix in the color filter substrate has a greater area ratio.

In order to increase the aperture ratio of the display panel, all of the gate control lines, except the gate control lines GL[1] and GL[N], are paired, and each pair of the gate control lines are corresponding to a single wiring region-black matrix element BMgl. In other word, if n is an even number and n<N, two adjacent gate control lines GL[n] and GL[n+1] correspond to the same wiring region-black matrix element BMgl[n][n+1]. Because each pair of gate control lines share a single wiring region-black matrix element, the quantity of the wiring region-black matrix elements BMgl can be reduced. In another embodiment, the gate control lines GL[1] and GL[N] can also be selectively not set to meet specific design requirements.

According to the concept of the disclosure, the arrangement and layout of the buffer circuit units, the signal lines, and the pixel circuits may vary as desired. In addition to FIG. 4, FIG. 7~FIG. 10 give other possible arrangements. In practical application, the arrangement of the buffer circuit units, the signal lines, and the pixel circuits might be different from the ones described in the specification. To simplify the description, the condition is set as N=4 in the embodiments with reference to FIG. 7~FIG. 10.

Figure 7:
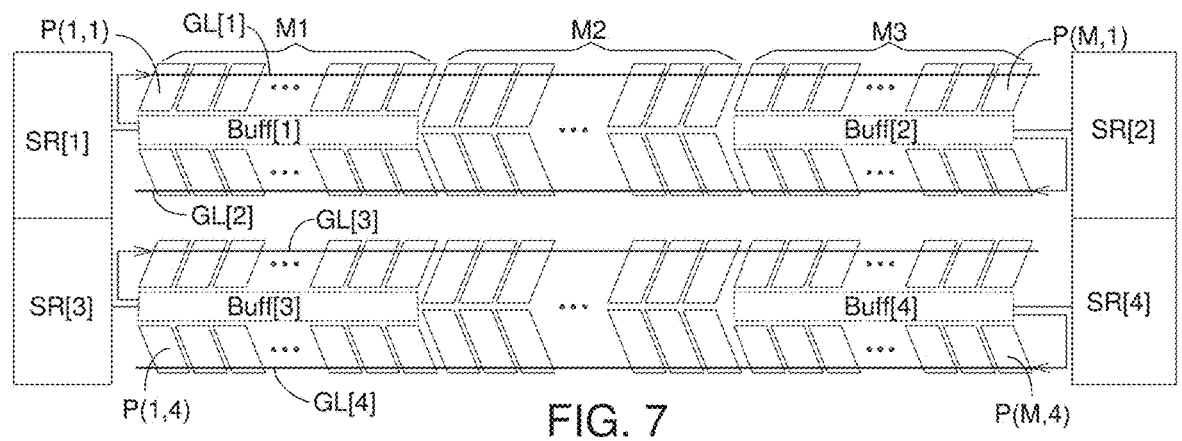
FIG. 7 is a top view illustrating the pixel circuits and the gate control circuit of the display panel according to an embodiment of the disclosure.

Please refer to FIG. 7, which is a top view illustrating the pixel circuits and the gate control circuit of the display panel according to an embodiment of the disclosure. In an embodiment, the gate control lines GL[1]~GL[N] may go through a portion of the pixel circuits. For example, the gate control lines GL[1], GL[2], GL[3] and GL[4] partially overlap the first row, the second row, the third row and the fourth row of pixel circuits P(1,1)~P(M,1), P(1,2)~P(M,2), P(1,3)~P(M,3) and P(1,4)~P(M,4), respectively. Accordingly, only a portion of the first row of pixel circuits P(1,1)~P(M,1) and a portion of the second row of pixel circuits P(1,2)~P(M,2) are located between the gate control line GL[1] and the gate control line GL[2]. Also, only a portion of the third row of pixel circuits P(1,3)~P(M,3) and a portion of the fourth row of pixel circuits P(1,4)~P(M,4) are located between the gate control line GL[3] and the gate control line GL[4].

It is to be noted that in addition to the gate control lines GL[1]~GL[N], the display panel may include other signal lines extending along the same direction. For example, the gate control lines and the common signal lines may extend along the x-direction.

Figure 8:
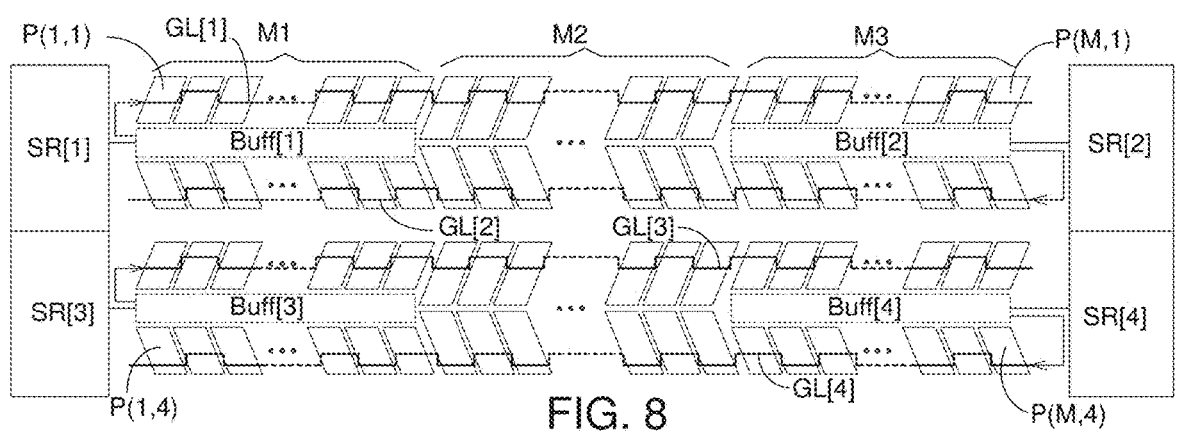
FIG. 8 is a top view illustrating the pixel circuits and the gate control circuit of the display panel according to another embodiment of the disclosure.

Please refer to FIG. 8, which is a top view illustrating the pixel circuits and the gate control circuit of the display panel according to another embodiment of the disclosure. Similar to the embodiment with reference to FIG. 7, the gate control lines GL[1], GL[2], GL[3] and GL[4] partially overlap the first row, the second row, the third row and the fourth row of pixel circuits P(1,1)~P(M1,1), P(1,2)~P(M1,2), P(1,3)~P(M1,3) and P(1,4)~P(M1,4), respectively. The embodiments differ in that the gate control lines GL[1]~GL[N] may not be straight lines.

FIG. 4~FIG. 8 depict the arrangement of the gate control lines GL relative to the pixel circuits P. It is to be noted that similar arrangement may be applied to different types of signal lines, for example, common signal lines and scan lines, but is not limited to, relative to the pixel circuits. Accordingly, FIG. 9 and FIG. 10 depict embodiments regarding the arrangement of the data lines SL in particular.

Please refer to FIG. 9, which is a top view illustrating the pixel circuits and the gate control circuit of the display panel according to a further embodiment of the disclosure. To simplify the description, the condition is set as M1=M3=4 in the embodiment. In practice, the values of M1 and M3 vary with the width of the buffer circuit units Buff.

In an embodiment, the display panel includes a first pixel circuit P(m,n); a second pixel circuit P(m+1,n) adjacent to the first pixel circuit P(m,n); a first signal line (first data line) SL[m] electrically connected to the first pixel circuit P(m,n); a second signal line (second data line) SL[m+1] electrically connected to the second pixel circuit P(m+1,n); a first buffer circuit unit Buff[m] disposed between the first pixel circuit P(m,n) and the second pixel circuit P(m+1,n), wherein at least a portion of the first pixel circuit P(m,n) and at least a portion of the second pixel circuit P(m+1,n) are disposed between first signal line (first data line) SL[m] and the second signal line (second data line) SL[m+1]; a third pixel circuit P(m+2,n) adjacent to the second pixel circuit P(m+1,n); a third signal line (third data line) SL[m+2] electrically connected to the third pixel circuit P(m+2,n), wherein the second signal line (second data line) SL[m+1] and the third signal line (third data line) SL[m+2] are disposed between the second pixel circuit P(m+1,n) and the third pixel circuit P(m+2,n); and a second buffer circuit unit Buff[m+2] adjacent to the first buffer circuit unit Buff[m], wherein the second pixel circuit P(m+1,n) and the third pixel circuit P(m+2,n) are disposed between the first buffer circuit unit Buff[m] and the second buffer circuit unit Buff[m+2].

For example, the display panel includes a first pixel circuit P(1,2), a second pixel circuit P(2,2) adjacent to the first pixel circuit P(1,2), a first signal line (first data line) SL[1] electrically connected to the first pixel circuit P(1,2), a second signal line (second data line) SL[2] electrically connected to the second pixel circuit P(2,2), a first buffer circuit unit Buff[1] disposed between the first pixel circuit P(1,2) and the second pixel circuit P(2,2), a third pixel circuit P(3,2) adjacent to the second pixel circuit P(2,2), a third signal line (third data line) SL[3] electrically connected to the third pixel circuit P(3,2), and a second buffer circuit unit Buff[3] adjacent to the first buffer circuit unit Buff[1]. At least a portion of the first pixel circuit P(1,2) and at least a portion of the second pixel circuit P(2,2) are disposed between first signal line (first data line) SL[1] and the second signal line (second data line) SL[2]. The second signal line (second data line) SL[2] and the third signal line (third data line) SL[3] are disposed between the second pixel circuit P(2,2) and the third pixel circuit P(3,2). The second pixel circuit P(2,2) and the third pixel circuit P(3,2) are disposed between the first buffer circuit unit Buff[1] and the second buffer circuit unit Buff[3].

Similar to the description about the first column to the fourth column of pixel circuits, the arrangement of other columns of pixel circuits, the data lines SL and the buffer circuit units Buff could be derived therefrom, and similar description is not given herein. Among the (M1+1)th column to the (M1+M2)th column of pixel circuits, no buffer circuit unit Buff is disposed between the adjacent pixel circuits.

Therefore, the data lines SL[M1+1]~SL[M1+M2] could be disposed between any two adjacent columns of pixel circuits.

In FIG. 9 and FIG. 10, that include two types of the pixel circuits, wherein one type of the pixel circuits is disposed between the data lines SL and the buffer circuit units Buff, and the other type of the pixel circuits is disposed between the adjacent data lines SL. It is shown in FIG. 9 and FIG. 10 that the pixel circuits disposed between the data lines SL and the buffer circuit units Buff have a smaller area than those disposed between the adjacent data lines. While adopting the concept of the embodiments with reference to FIG. 9 and FIG. 10, N is a multiple of 4.

According to the disclosure, the shape of the pixel circuits P(m,n) may be (FIG. 10) or may be not (FIG. 4~FIG. 9) a rectangular. In the embodiments with reference to FIG. 9 and FIG. 10, the data lines SL and the pixel circuits do not overlap. However, the positions of the data lines relative to the pixel circuits could be modified as the arrangement of the gate control lines and the pixel circuits in FIG. 7 and FIG. 8, and similar description is not given herein.

As described above with reference to FIG. 5, the display panel may include a black matrix (for example, made of photoresist material) covering the buffer circuit units. The concept could be applied to the embodiments with reference to FIG. 7~FIG. 10. The shape and the position of the black matrix vary with the arrangement of the buffer circuit units and the signal lines. Please refer to the above embodiments for the related applications, and the details are not given herein.

As described above, less light can be transmitted through a region where the black matrix has a greater area ratio so as to cause lower brightness. Hence, in an embodiment, the pixel-active area Apr further includes gradation areas Apr_grd1, Apr_grd2 at both sides.

Figure 11:
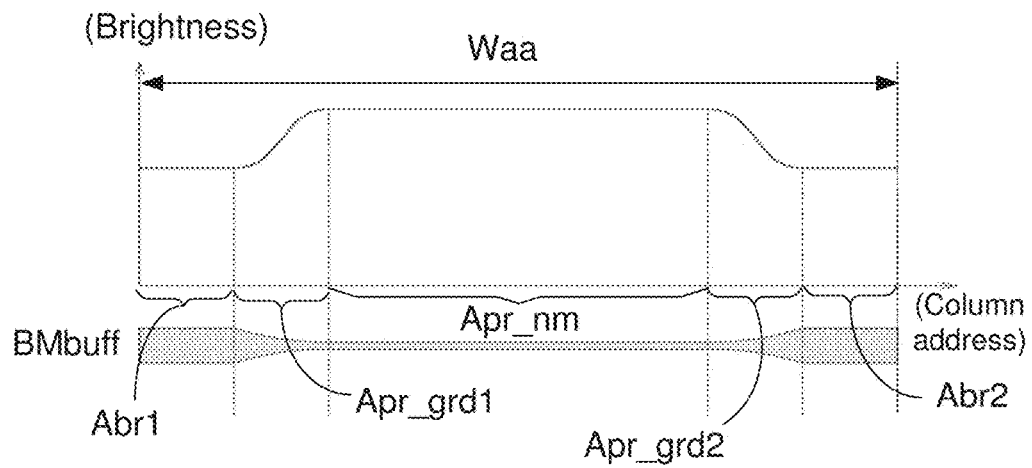
FIG. 11 is a schematic diagram illustrating that the aperture ratio is improved by modifying the shape of the black matrix.

Please refer to FIG. 11, which is a schematic diagram illustrating that the aperture ratio is improved by modifying the area of the black matrix. In FIG. 11, the pixel-active area Apr includes three portions, that is, a gradation-pixel-active area Apr_grd1, a normal-pixel-active area Apr_nm and another gradation-pixel-active area Apr_grd2. The gradation-pixel-active area Apr_grd1 is provided between the buffer-active area Abr1 and the normal-pixel-active area Apr_nm. The gradation-pixel-active area Apr_grd2 is provided between the normal-pixel-active area Apr_nm and the buffer-active area Abr2.

In order to improve the nonuniform brightness of the active area, the width of the buffer region-black matrix element BMbuff is gradually reduced from the buffer-active area Abr1, Abr2 to the normal-pixel-active area Apr. The gradation-pixel-active areas Apr_grd1, Apr_grd2 serve as transition areas where the buffer region-black matrix element BMbuff has a gradually reduced or increased width.

As shown in FIG. 11, the widest portion of the buffer region-black matrix element BMbuff is overlapped the buffer-active area Abr1, Abr2, and the narrowest portion of the buffer region-black matrix element BMbuff is overlapped the normal-pixel-active area Apr_nm. Along the direction of the column address, the buffer region-black matrix element BMbuff is widest at the buffer-active area Abr1, gradually narrows at the gradation-pixel-active area Apr_grd1 toward the normal-pixel-active area Apr_nm, becomes narrowest at the normal-pixel-active area Apr_nm, gradually widens at the gradation-pixel-active area Apr_grd2 toward the buffer-active area Abr2, and becomes widest at the buffer-active area Abr2.

The width of the buffer region-black matrix element BMbuff at the gradation-active areas Apr_grd1, Apr_grd2 gradually decreases or increases. Because of the gradual changes of the gradation-active areas Apr_grd1, Apr_grd2, the affect of the buffer region-black matrix element BMbuff to the aperture ratio become gradually adjusted and changed.

In another embodiment, in order not to change the manufacturing process of the display panel, the display effect of the display panel could be improved by adjusting the grayscale voltages transmitted through the data lines.

Figures 12, 13:
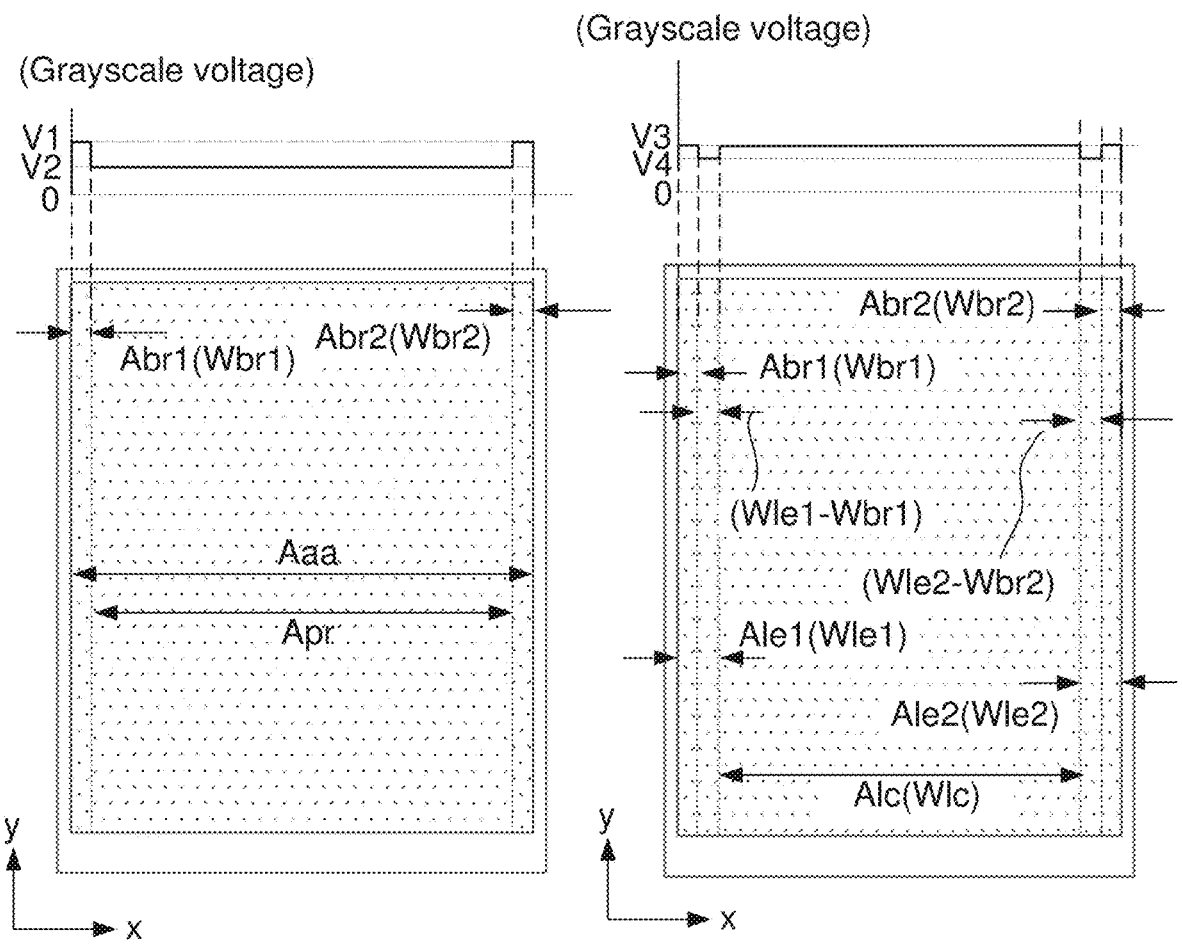
FIG. 12 is a top view illustrating that the brightness of the pixel circuits at the pixel-active area is reduced to homogenize the entire brightness.
FIG. 13 is a top view illustrating that the brightness of the display panel is further compensated by adjusting the gray-scale voltages and arrangement of the light-emitting diodes.

Please refer to FIG. 12, which is a top view illustrating that the brightness (grayscale voltage) of the pixel circuits at the pixel-active area is reduced to homogenize the entire brightness. For a monochromic image (for example, white, red, blue or green), the pixel circuits at the pixel-active area Apr provide lower grayscale voltages (for example, a grayscale voltage corresponding to a grayscale value of 222) to make the pixel circuits to show lower brightness data; and the pixel circuits at the buffer-active areas Abr1, Abr2 provide greater grayscale voltages (for example, a grayscale voltage corresponding to a grayscale value of 256) to make the pixel circuits to show higher brightness data. For example, the pixel circuits at the buffer-active areas Abr1, Abr2 provide a first grayscale voltage V1, and the pixel circuits at the pixel-active area Apr provide a second grayscale voltage V2 wherein the first grayscale voltage V1 is higher than the second grayscale voltage V2. Thus, the compensated (visual) brightness at the buffer-active areas Abr1, Abr2 is substantially identical to that at the pixel-active area Apr. Such compensation (grayscale voltage adjustment) can be calculated according to the difference between the aperture ratio (ARhigh) at the pixel-active area Apr and the aperture ratio (ARlow) at the buffer-active areas Abr1, Abr2 and gamma correction. Thus, the calculation result determines the lowered grayscale voltage of the pixel circuits at the pixel-active area Apr to eliminate the dark band so that the image could be shown with uniform visual brightness.

Please refer to FIG. 13, which is a top view illustrating another embodiment of the disclosure. As shown in FIG. 13, for a monochromic image (for example, white, red, blue or green), different grayscale voltages are provided according to the positions of the pixel circuits. In the embodiment, the active area of the display panel includes five sub-areas Abr1, Ale1-Abr1, Alc, Ale2-Abr2, and Abr2 whose definitions will be given while referring to FIG. 15 later. Among these sub-areas, the pixel circuits at the leftmost sub-area and the rightmost sub-area provide a third grayscale voltage V3; the pixel circuits at the second leftmost sub-area and the second rightmost sub-area provide a fourth grayscale voltage V4; and the pixel circuits at the middle sub-area provide the third grayscale voltage V3, wherein the third grayscale voltage V3 is higher than the fourth grayscale voltage V4.

According to the embodiments with reference to FIG. 12 and FIG. 13, the display panel can dynamically lower the grayscale voltage corresponding to the bright band and raise the grayscale voltage corresponding to the dark band. In practice, the positions and areas of the sub-areas requiring grayscale adjustment and the amplitudes of the grayscale voltages are not limited to the embodiments with reference to FIG. 12 and FIG. 13.

Figure 14:
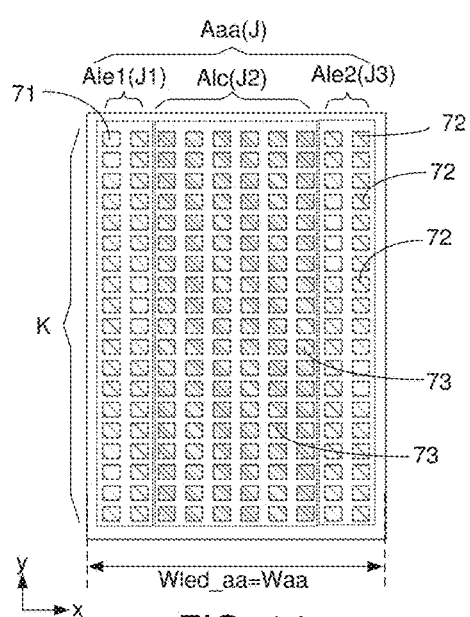
FIG. 14 is a top view illustrating the light-emitting elements arranged in an array in the light source layer.

Please refer to FIG. 14, which is a top view illustrating another embodiment of the disclosure. In this embodiment, the light source layer includes multiple light-emitting elements arranged in an array. The light source layer corresponding to the active area Aaa includes the multiple light-emitting elements arranged in J columns and K rows, and J and K are positive integers. The light-emitting elements may be light-emitting diodes (LED). As usual, the resolution (LED density) of the light source layer is slightly lower than the resolution of the pixel circuits on the thin film transistor substrate (that is, J is less than M, and K is less than N). In this embodiment, the light source layer corresponding to the active area means that the light source layer issues light to the active area.

Corresponding to the respective sub-areas of the active area Aaa, the light source layer includes a first brightness enhancement area Ale1 disposed at one side, a second brightness enhancement area Ale2 disposed at an opposite side and a normal brightness area Alc disposed between the first brightness enhancement area Ale1 and the second brightness enhancement area Ale2. The first brightness enhancement area Ale1 comprises J1 columns of first light-emitting diodes 71; the normal brightness area Alc comprises J2 columns of third light-emitting diodes 73; and the second brightness enhancement area Ale2 comprises J3 columns of second light-emitting diodes 72, wherein J1, J2 and J3 are positive integers, J is a sum of J1~J3, J1 is equal to J3, and J2 is greater than J1.

According to the embodiment of the disclosure, the first brightness enhancement area Ale1 of the light source layer and the first buffer-active area Abr1 substantially overlap each other in a top view (along the z-direction); the normal brightness area Alc of the light source layer and the pixel-active area Apr substantially overlap each other along the z-direction; and the second brightness enhancement area Ale2 of the light source layer and the second buffer-active area Abr2 substantially overlap each other along the z-direction. Therefore, the light-emitting diodes 71, 72 at the first brightness enhancement area Ale1 and the second brightness enhancement area Ale2 have higher brightness than the light-emitting diodes 73 at the normal brightness area Alc. That is to say, in an embodiment, the light source layer includes the first brightness enhancement area, the second brightness enhancement area, and the normal brightness area disposed between the first brightness enhancement area and the second brightness enhancement area. While displaying a monochromic image, the brightness of the light-emitting diodes at the first brightness enhancement area and the second brightness enhancement area is higher than that at the normal brightness area.

As described above, the first column to the (J1)-th column of light-emitting diodes 71 have a higher brightness than the (J1+1)-th column to the (J1+J2)-th column of light-emitting diodes 73; the brightness of the first column to the (J1)-th column of light-emitting diodes 71 have an identical brightness to the (J1+J2+1)-th column to the Jth column of light-emitting diodes 72; and the (J1+1)-th column to the (J1+J2)-th column of light-emitting diodes 73 have a lower brightness than the (J1+J2+1)-th column to the Jth column of light-emitting diodes 72. In other words, in a monochromic image, the brightness enhancement areas have a higher brightness than the normal brightness area.

In another embodiment, the buffer-active area is optionally disposed at only one side of the display panel, and the light source layer includes a first brightness enhancement area and a normal brightness area adjacent to the first brightness enhancement area. Whiling displaying a monochromic image, the first brightness enhancement area have a higher brightness than the normal brightness area.

Figure 15:
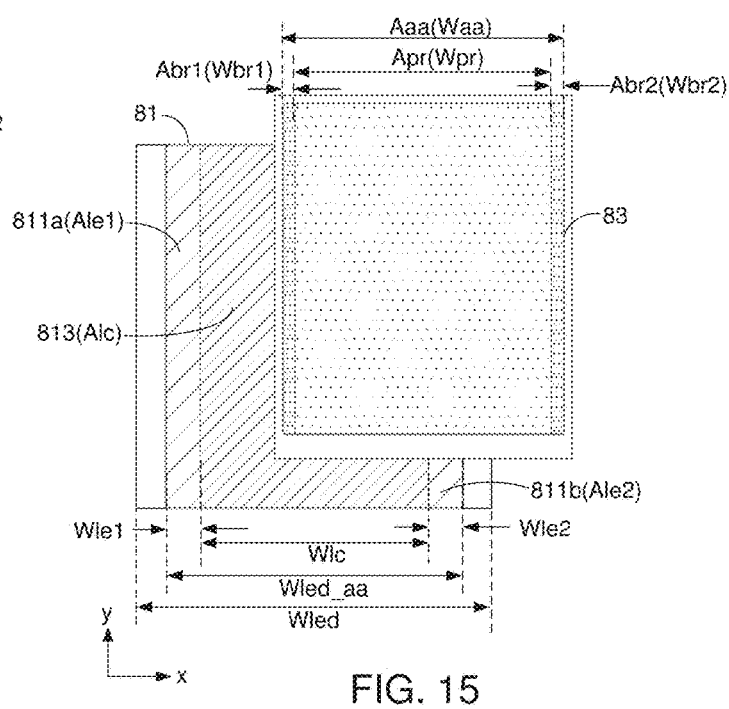
FIG. 15 is a top view illustrating the combination of the display panel and the backlight module.

Please refer to FIG. 15, which is a top view illustrating the combination of the display panel and the backlight module. The active area Aaa of the display panel 83 has a width Waa, and includes a pixel-active area Apr (width Wpr), a buffer-active area Abr1 (width Wbr1) and a buffer-active area Abr2 (width Wbr2). The light source layer 81 has a width Wled in which the portion provides light to the active area Aaa has a width Wled_aa. The portion of the light source layer 81 provides light to the active area Aaa includes the brightness enhancement area 811a (Ale1), the normal brightness area 813 (Alc), and the brightness enhancement area 811b (Ale2).

Figure 16:
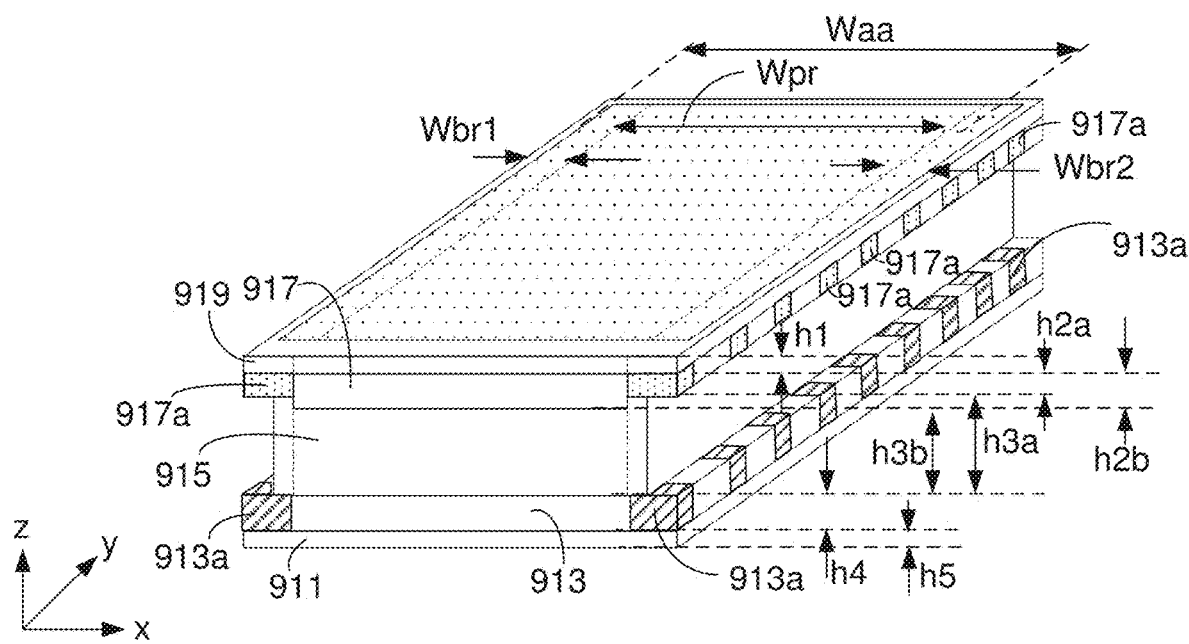
FIG. 16 is a perspective view illustrating that the brightness uniformity is improved by adjusting the thickness of layers above the liquid crystal layer.
Figure 17:
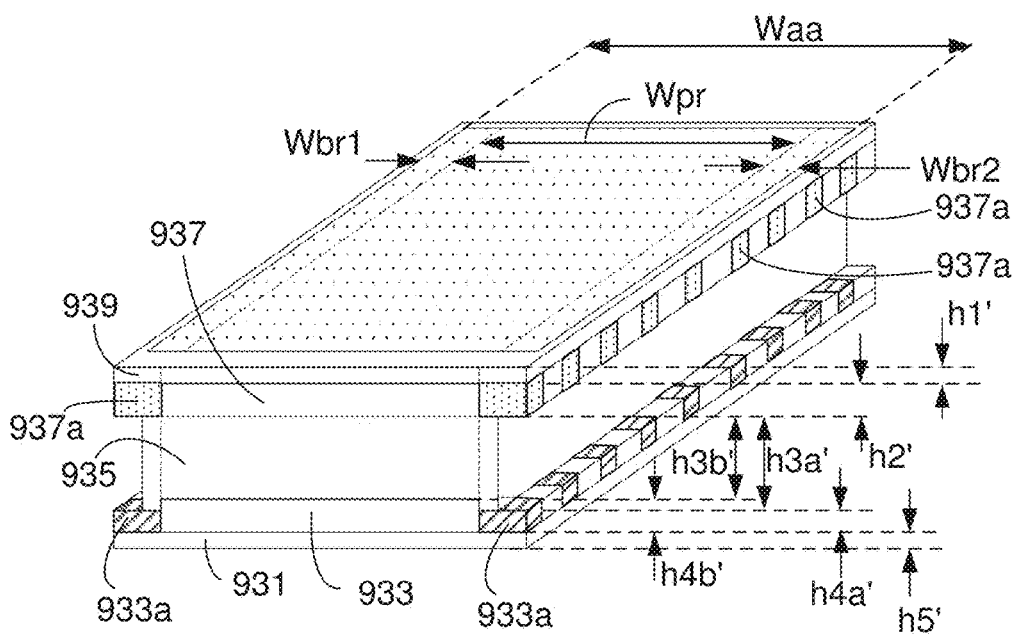
FIG. 17 is a perspective view illustrating that the brightness uniformity is improved by adjusting the thickness of layers below the liquid crystal layer.

According to the concept of the disclosure, in addition to the compensation made on the backlight module, the compensation for the light transmission loss due to low aperture ratio resulting from the black matrix may be performed by modifying the structure of the display panel. For example, the problem about the dark band at the buffer-active areas Abr1, Abr2 can be reduced by changing the thickness of the specific internal layer(s) of the display panel. In FIG. 16 and FIG. 17, the thickness of the thin film transistor substrate or the color filter substrate corresponding to the buffer-active areas Abr1, Abr2, is locally reduced to increase the transmittance at the buffer-active areas Abr1, Abr2 and eliminate the influence due to nonuniform aperture ratio.

Please refer to FIG. 16, which is a perspective view illustrating that the dark band at both sides of the display panel is reduced by adjusting the thickness of layers above the liquid crystal layer. The function and property of each layer have been described while referring to FIG. 3 and similar description would not be given again. In this diagram, it is shown that spaced buffer circuit units 913a are disposed on the thin film transistor substrate 913, and spaced black matrix elements 917a are disposed on the color filter substrate 917.

In the structure of the display panel, the polarizing film 911 has a substantially constant thickness h5 over the active area; the thin film transistor substrate 913 has a substantially constant thickness h4 over the active area; the liquid crystal layer 915 has varied thickness h3a, h3b respectively corresponding to different sub-areas (pixel-active area Apr and buffer-active areas Abr1, Abr2); the color filter substrate 917 has varied thickness h2a, h2b respectively corresponding to different sub-areas (pixel-active area Apr and buffer-active areas Abr1, Abr2); and the polarizing film 919 has a substantially constant thickness h1 over the active area.

The liquid crystal layer 915 has a thickness h3b at the pixel-active area Apr, and has a thickness h3a at the buffer-active areas Abr1, Abr2, wherein the thickness h3b is smaller than the thickness h3a (h3b<h3a). The color filter substrate 917 has a thickness h2b at the pixel-active area Apr, and has a thickness h2a at the buffer-active areas Abl1, Abr2, wherein the thickness h2b is greater than the thickness h2a (h2b>h2a). In other words, the color filter substrate 917 has a relatively thin portion at the buffer-active areas Abr1, Abr2, and a relatively thick portion at the pixel-active area Apr. The liquid crystal layer 915 has a relatively thick portion at the buffer-active areas Abr1, Abr2 and a relatively thin portion at the pixel-active area Apr. In this embodiment, the thickness of the color filter substrate is the distance between the upper surface of the color filter substrate and the lower surface of the color filter substrate in contact with the display medium.

Please refer to FIG. 17, which is a perspective view illustrating that the dark band at both sides of the display panel is improved by adjusting the thickness of layers below the liquid crystal layer. The function and property of each layer have been described while referring to FIG. 3 and similar description would not be given again. In this diagram, it is shown that spaced buffer circuit units 933a are disposed on the thin film transistor substrate 933, and spaced black matrix elements 937a are disposed on the color filter substrate 937.

In the structure of the display panel, the polarizing film 931 has a substantially constant thickness h5' over the active area; the thin film transistor substrate 933 has varied thickness h4a', h4b' respectively corresponding to different sub-areas (pixel-active area Apr and buffer-active areas Abr1, Abr2); the liquid crystal layer 935 has varied thickness h3a', h3b' respectively corresponding to different sub-areas (pixel-active area Apr and buffer-active areas Abr1, Abr2); the color filter substrate 937 has a substantially constant thickness h2' over the active area; and the polarizing film 939 has a substantially constant thickness h1' over the active area.

The liquid crystal layer 935 has a thickness h3b' at the pixel-active area Apr, and has a thickness h3a' at the buffer-active areas Abr1, Abr2, wherein the thickness h3b' is smaller than the thickness h3a' (h3b'<h3a'). The thin film transistor substrate 933 has a thickness h4b' at the pixel-active area Apr, and has a thickness h4a' at the buffer-active areas Abr1, Abr2, wherein the thickness h4b' is greater than the thickness h4a' (h4b'>h4a'). In other words, the thin film transistor substrate 933 has a relatively thin portion at the buffer-active areas Abr1, Abr2 and a relatively thick portion at the pixel-active area Apr. The liquid crystal layer 935 has a relatively thick portion at the buffer-active areas Abr1, Abr2 and a relatively thin portion at the pixel-active area Apr.

According to the above embodiments of the display panel, the buffer circuit units are moved to the active area Aaa to reduce the border area for the non-active area Anaa. Further, the light-shielding layer made of conductive material can reduce the area of the capacitors of the gate control circuit (FIG. 2A and FIG. 2B). Moreover, the direct light design of the electronic device and the use of adhesive layers (FIG. 3) can also reduce the border area.

The disclosure also provides compensation for the non-uniform aperture ratio resulting from the black matrix which is used for shielding the buffer circuit units disposed at the active area Aaa. The compensation involves, for example, gradually changing the area of the black matrix at the gradation areas to homogenize the entire brightness (FIG. 11); adjusting the grayscale voltages of the pixel circuits at different sub-areas of the active area (FIG. 12 and FIG. 13); adjusting the current for driving the light-emitting diodes at the buffer-active areas Abr1, Abr2 to enhance the brightness of the light-emitting diodes (FIG. 14); and making any layer of the display panel to have different thicknesses at different sub-areas (FIG. 16 and FIG. 17). The disclosure does not limit the compensation methods for the buffer-active areas Abr1, Abr2, and the pixel-active area Apr. The compensation methods in the embodiments could be used individually or combined as desired to narrow the border region of the display panel under consideration of visual performance.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device comprising:
a display panel comprising:
a first pixel circuit;
a second pixel circuit adjacent to the first pixel circuit;
a third pixel circuit adjacent to the second pixel circuit, the second pixel circuit disposed between the first pixel circuit and the third pixel circuit;
a first signal line electrically connected to the first pixel circuit;
a second signal line electrically connected to the second pixel circuit;
a third signal line electrically connected to the third pixel circuit; and
a first buffer circuit unit disposed between the first pixel circuit and the second pixel circuit, wherein at least a portion of the first pixel circuit and at least a portion of the second pixel circuit are disposed between the first signal line and the second signal line, and the second signal line and the third signal line are disposed between the second pixel circuit and the third pixel circuit.

2. The electronic device according to claim 1, further comprising:
a shifter circuit unit comprising:
a light-shielding layer comprising a conductive material;
a buffer layer formed on the light-shielding layer;
a polysilicon layer formed on the buffer layer;
a gate insulating layer formed on the polysilicon layer;
a first metal layer formed on the gate insulating layer;
an interlayer dielectric formed on the first metal layer; and
a second metal layer formed on the interlayer dielectric,
wherein the interlayer dielectric, the first metal layer and the second metal layer collectively form a first capacitor, the gate insulating layer, the first metal layer and the polysilicon layer collectively form a second capacitor, and the buffer layer, the polysilicon layer and the light-shielding layer collectively form a third capacitor.

3. The electronic device according to claim 2, wherein:
the second metal layer is electrically connected to the polysilicon layer; and
the first metal layer is electrically connected to the light-shielding layer, wherein the first capacitor, the second capacitor and the third capacitor are connected in parallel.

4. An electronic device comprising:
a display panel comprising:
a first pixel circuit;
a second pixel circuit adjacent to the first pixel circuit;
a first signal line electrically connected to the first pixel circuit;
a second signal line electrically connected to the second pixel circuit; and
a first buffer circuit unit disposed between the first pixel circuit and the second pixel circuit, wherein at least a portion of the first pixel circuit and at least a portion of the second pixel circuit are disposed between the first signal line and the second signal line; and
a light source layer comprising:
a first brightness enhancement area; and
a normal brightness area, wherein the first brightness enhancement area has a greater brightness than the normal brightness area while displaying a monochromic image.

5. The electronic device according to claim 4, wherein the display panel further comprising a shifter circuit unit partially overlapping the light source layer.

6. The electronic device according to claim 5, wherein the shifter circuit unit is electrically connected to the first buffer circuit unit, and the first buffer circuit unit amplifies a first gate control signal received from the shifter circuit unit.

7. The electronic device according to claim 4, wherein the light source layer further comprises a second brightness enhancement area, wherein
the normal brightness area is disposed between the first brightness enhancement area and the second brightness enhancement area, and the second brightness enhancement area has a greater brightness than the normal brightness area while displaying the monochromic image.

8. The electronic device according to claim 7, wherein the light source layer comprises:
a first light-emitting diode disposed at the first brightness enhancement area;
a second light-emitting diode disposed at the second brightness enhancement area; and
a third light-emitting diode disposed at the normal brightness area, wherein the first light-emitting diode has a greater brightness than the third light-emitting diode, and the second light-emitting diode has a greater brightness than the third light-emitting diode.

9. The electronic device according to claim 4, wherein at least a portion of the first buffer circuit unit is overlapped with the first brightness enhancement area.

10. The electronic device according to claim 4, wherein the light source layer comprises light-emitting diodes (LED), mini light-emitting diodes (Mini LED), or micro light-emitting diodes (Micro-LED).

11. The electronic device according to claim 4, wherein the display panel comprises:
a liquid crystal layer, wherein a thickness of the liquid crystal layer in the first brightness enhancement area is greater than a thickness of the liquid crystal layer in the normal brightness area.

12. The electronic device according to claim 11, wherein the display panel further comprises:
a color filter substrate, disposed on the liquid crystal layer, wherein a thickness of the color filter substrate in the first brightness enhancement area is less than a thickness of the color filter substrate in the normal brightness area.

13. The electronic device according to claim 11, wherein the display panel further comprises:
a thin film transistor substrate, wherein the liquid crystal layer is disposed on the thin film transistor substrate, and a thickness of the thin film transistor substrate in the first brightness enhancement area is less than a thickness of the thin film transistor substrate in the normal brightness area.

14. The electronic device according to claim 4, wherein the display panel comprises:
a buffer-active area disposed in the first buffer circuit unit; and
a pixel-active area adjacent to the buffer-active area,
wherein a third pixel circuit at the buffer-active area shows data according to a first grayscale voltage, and a fourth pixel circuit at the pixel-active area shows data according to a second grayscale voltage lower than the first grayscale voltage while displaying a monochromic image.

15. The electronic device according to claim 1, wherein the display panel further comprises a second buffer circuit unit adjacent to the first buffer circuit unit,
wherein at least a portion of the second pixel circuit and at least a portion of the third pixel circuit are disposed between the first buffer circuit unit and the second buffer circuit unit.

16. The electronic device according to claim 1, wherein the first signal line, the second signal line, and the third signal line are gate control lines or data lines.

17. The electronic device according to claim 1, wherein the display panel further comprises:
a fourth pixel circuit adjacent to the first pixel circuit, wherein the fourth pixel circuit is electrically connected to the first signal line, and size of the fourth pixel circuit is greater than size of the first pixel circuit.

18. An electronic device comprising:
a display panel comprising:
a first pixel circuit;
a second pixel circuit adjacent to the first pixel circuit;
a first signal line electrically connected to the first pixel circuit;
a second signal line electrically connected to the second pixel circuit;
a first buffer circuit unit disposed between the first pixel circuit and the second pixel circuit, wherein at least a portion of the first pixel circuit and at least a portion of the second pixel circuit are disposed between the first signal line and the second signal line; and
a black matrix, comprising a first black matrix element and a second black matrix element, wherein the first black matrix element covers the first signal line and the second black matrix element covers the first buffer circuit unit.

19. The electronic device according to claim 18, wherein a shape of the second black matrix element is different from a shape of the first black matrix element.

* * * * *